US008318515B2

(12) United States Patent
Bhat

(10) Patent No.: US 8,318,515 B2
(45) Date of Patent: Nov. 27, 2012

(54) GROWTH METHODOLOGY FOR LIGHT EMITTING SEMICONDUCTOR DEVICES

(75) Inventor: Rajaram Bhat, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 150 days.

(21) Appl. No.: 12/633,216

(22) Filed: Dec. 8, 2009

(65) Prior Publication Data

US 2011/0136280 A1    Jun. 9, 2011

(51) Int. Cl.
*H01L 21/00* (2006.01)
(52) U.S. Cl. ............. 438/29; 438/34; 438/478; 438/48; 257/E21.097
(58) Field of Classification Search .............. 438/29, 438/34, 478, 483, 485; 257/E21.097
See application file for complete search history.

(56) References Cited

U.S. PATENT DOCUMENTS

| 5,851,905 A | 12/1998 | McIntosh et al. | |
| 2004/0012014 A1* | 1/2004 | Yamanaka et al. | 257/13 |
| 2006/0049415 A1* | 3/2006 | Liao et al. | 257/94 |
| 2008/0311695 A1 | 12/2008 | Ogawa et al. | 438/46 |
| 2009/0246944 A1 | 10/2009 | Keller et al. | 438/478 |
| 2011/0027974 A1* | 2/2011 | Su et al. | 438/478 |

FOREIGN PATENT DOCUMENTS

| WO | 02/01608 | 1/2002 |
| WO | 2004/034437 | 4/2004 |

OTHER PUBLICATIONS

"Silver-clad nitride semiconductor laser diode"; Bour et al; Applied Physics Letters 94, 041124 (2009).
"Characteristics of p-type GaN films doped with isoelectronic indium atoms"; Chang et al; Chinese Journal of Physics, vol. 40, No. 6, Dec. 2002.

(Continued)

*Primary Examiner* — Eugene Lee
*Assistant Examiner* — Elias M Ullah
(74) *Attorney, Agent, or Firm* — Gregory V. Bean

(57) ABSTRACT

A method of manufacturing an optoelectronic light emitting semiconductor device is provided where a Multi-quantum Well (MQW) subassembly is subjected to reduced temperature vapor deposition processing to form one or more of n-type or p-type layers over the MQW subassembly utilizing a plurality of precursors and an indium surfactant. The precursors and the indium surfactant are introduced into the vapor deposition process at respective flow rates with the aid of one or more carrier gases, at least one of which comprises $H_2$. The indium surfactant comprises an amount of indium sufficient to improve crystal quality of the p-type layers formed during the reduced temperature vapor deposition processing and the respective precursor flow rates and the $H_2$ content of the carrier gas are selected to maintain a mole fraction of indium from the indium surfactant to be less than approximately 1% in the n-type or p-type layers. In another embodiment, the reduced temperature vapor deposition processing is executed at a reduced temperature $T_G$, where $T_G \leq T_B \pm 5\%$ and $T_B$ is the MQW barrier layer growth temperature. Additional embodiments are disclosed and claimed.

20 Claims, 2 Drawing Sheets

OTHER PUBLICATIONS

"High doping level in Mg-doped GaN layers grown at low temperature"; Dussaigne et al; Journal of Applied Physics 103, 013110, 2008.

"531 nm green lasing of InGaN based laser diodes on semi-polar (2021) free-standing GaN substrates"; Enya et al; Applied Physics Express 2 (2009) 082101.

"Room-temperature CW lasing of a GaN-based vertical-cavity surface-emitting laser by current injection"; Higuchi et al; Applied Physics Express 1 (2008) 121102.

"CW lasing of current injection blue GaN-based vertical cavity surface emitting laser"; Lu et al; Applied Physics Letters 92, 141102 (2008).

"Indium versus hydrogen-terminated GaN (0001) surfaces: surfactant effect of indium in a chemical vapour deposition environment"; Northrup et al; Applied Physics Letters, vol. 84, No. 21 (May 24, 2004).

Dupuis R. D.: "Epitaxial growth of III-V nitride semiconductors by metalorganic chemical vapour deposition" Journal of Crystal Growth, vol. 178, No. 1-2, Jun. 1, 1997, pp. 56-73.

Kim C. S.: "Isoelectronic in doping in p-GaN and its effects on InGaN light emitting diodes", Journal of the Korean Physcial Society, vol. 45, No. 5, Nov. 2004, pp. 1391-1394.

Feng Z. H.: "Effect on the optical properties and surface morphology of cubic GaN grown by metalorganic chemical vapour deposition using isoelectronic indium surfactant doping", Journal of Crystal Growth, vol. 235, No. 1-4, Feb. 1, 2002, pp. 207-211.

Redwing et al: "B2.7 MOVPE of GaN and related compounds", Jan. 1, 1999, pp. 416-425.

\* cited by examiner

GROWTH METHODOLOGY FOR LIGHT EMITTING SEMICONDUCTOR DEVICES

BACKGROUND

The present disclosure relates to optoelectronic light emitting semiconductor devices and, more particularly, to methods of manufacturing the same.

BRIEF SUMMARY

According to the present disclosure, methods of manufacturing an optoelectronic light emitting semiconductor device, or portions thereof, are provided. In accordance with one embodiment, a method of manufacturing an optoelectronic light emitting semiconductor device is provided where a Multi-quantum Well (MQW) subassembly is subjected to reduced temperature vapor deposition processing to form one or more of n-type or p-type layers over the MQW subassembly utilizing a plurality of precursors and an indium surfactant. The precursors and the indium surfactant are introduced into the vapor deposition process at respective flow rates with the aid of one or more carrier gases, at least one of which comprises $H_2$. The indium surfactant comprises an amount of indium sufficient to improve crystal quality of the p-type layers formed during the reduced temperature vapor deposition processing and the respective precursor flow rates and the $H_2$ content of the carrier gas are selected to maintain a mole fraction of indium from the indium surfactant to be less than approximately 1% in the n-type or p-type layers. In another embodiment, the reduced temperature vapor deposition processing is executed at a reduced temperature $T_G$, where $T_G \leq T_B \pm 5\%$ and $T_B$ is the MQW barrier layer growth temperature. Additional embodiments are disclosed and claimed.

BRIEF DESCRIPTION OF THE SEVERAL VIEWS OF THE DRAWINGS

The following detailed description of specific embodiments of the present disclosure can be best understood when read in conjunction with the following drawings, where like structure is indicated with like reference numerals and in which.

DETAILED DESCRIPTION

Figure 1:
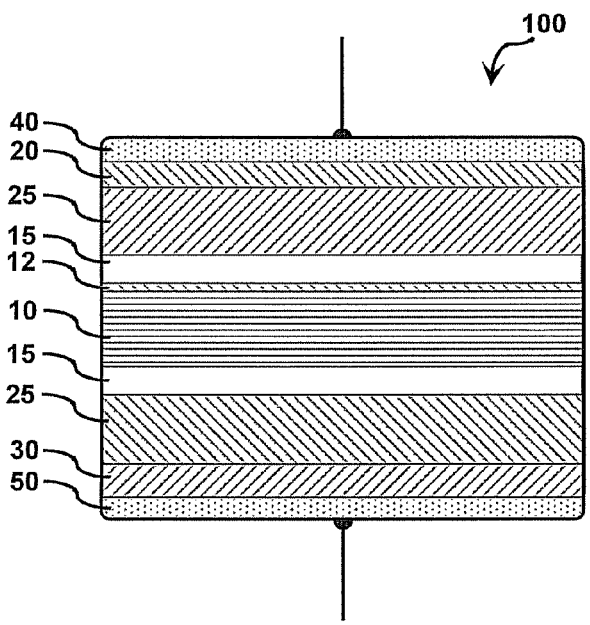
FIG. 1 is a schematic illustration of one type of optoelectronic light emitting semiconductor device that can be manufactured according to the teachings of the present disclosure.

FIG. 1 illustrates a laser diode wafer 100 comprising a multi-quantum well (MQW) active region 10, a p-type GaN nitride layer 20, an n-type layer 30, a p-side contact layer 40, an n-side contact layer 50. Laser diode wafers will typically further comprise a p-type electron blocking layer 12 (e.g., AlGaN or another suitable material), one or more waveguide layers 15 (e.g., GaN, GaInN, etc), and one or more cladding layers 25 (e.g., AlGaN, AlGaInN, a superlattice of AlGaN/GaN or AlGaInN/GaN, etc.). Typically, the layers above the MQW active region 10 will be p-type layers and the layers below the MQW active region 10 will be n-type layers. The MQW active region 10 emits light in response to the injection of electrons into the active region 10 and is formed over the n-type layer 30. As will be appreciated by those practicing the technology disclosed herein, the methodology of the present disclosure will be applicable to a variety of light emitting semiconductor devices comprising a multi-quantum well (MQW) active region, a p-type GaN layer, and an n-type layer including, but not limited to, configurations similar to that illustrated in FIG. 1 and other conventional and yet to be developed configurations for laser diodes and light emitting diodes.

Figure 2:
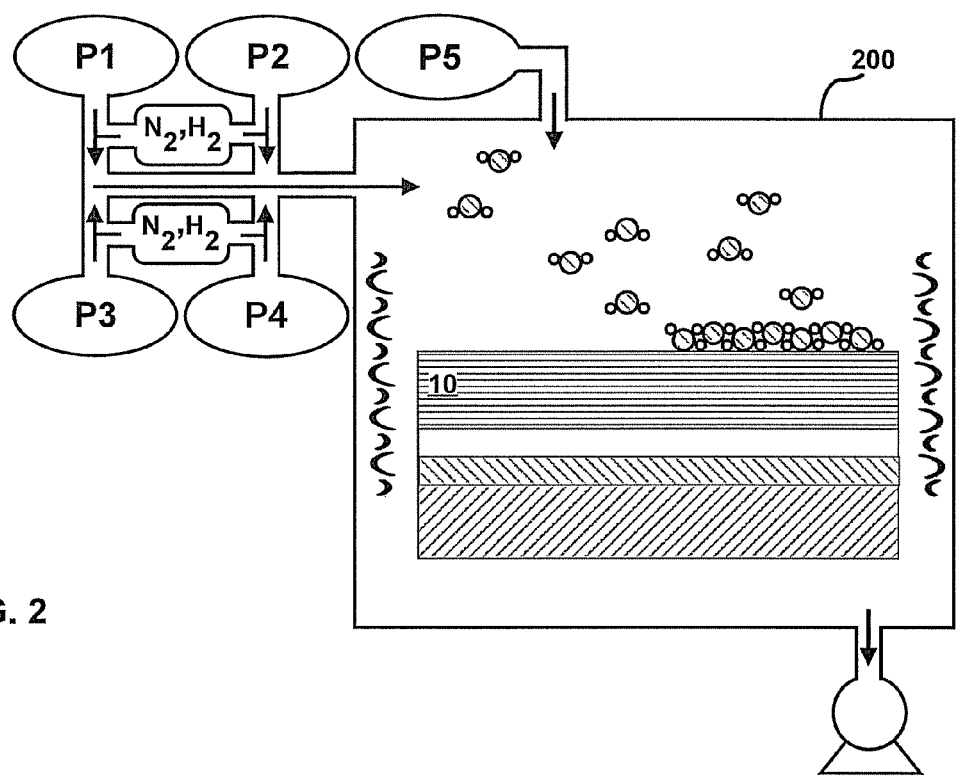
FIG. 2 is a schematic illustration of a vapor deposition process according to the present disclosure.

Referring to FIG. 2, the n-type layer 30 can be grown in a vapor deposition chamber 200 via a relatively high temperature vapor deposition process characterized by a n-type growth temperature $T_N$, which is typically greater than approximately 900° C. The MQW active region 10 can be formed over the n-type layer 30 in the same vapor deposition chamber via a vapor deposition process at a quantum well growth temperature $T_Q$ selected for the growth of the quantum wells of the MQW active region 10 and a barrier layer growth temperature $T_B$ selected for the growth of the barrier layers of the MQW active region 10. The barrier layer growth temperature $T_B$ will typically vary from case to case but is typically higher than or equal to the quantum well growth temperature $T_Q$. The resulting MQW subassembly, which comprises the MQW active region 10 and the n-type layer 30 is subjected to reduced temperature vapor deposition processing to form the p-type GaN layer 20 and any other wafer layers over the MQW subassembly, as is illustrated schematically in FIG. 2.

As is further illustrated schematically in FIG. 2, the reduced temperature vapor deposition process utilizes a plurality of precursors and an indium surfactant P1, P2, P3, P4, and P5. The precursors used in the reduced temperature vapor deposition process are configured to provide materials for the formation of the p-type GaN layer 20 and may, for example, comprise a nitrogen source (e.g., ammonia), one or more organometallic sources of Ga (e.g., TMG), and one or more organometallic sources of a crystal lattice dopant (e.g., Cp$_2$Mg (bis cyclopentadienyl magnesium)). The indium surfactant comprises an amount of indium sufficient to improve crystal quality of the p-type GaN layer 20 and any other wafer layers formed over the MQW subassembly during the reduced temperature vapor deposition processing and may, for example, comprise an organometallic source selected from TMI, TEI, etc.

The precursors and the indium surfactant P1-P5 are introduced into the vapor deposition process at respective flow rates with the aid of one or more carrier gases, which are identified in FIG. 2 schematically as "$N_2$, $H_2$" because nitrogen is a common carrier gas used in vapor deposition and because at least one of the carrier gases is hydrogen. This reduced temperature vapor deposition processing is executed at a reduced temperature $T_G$, where $T_G \leq T_B \pm 5\%$, which relation contemplates that $T_G$ could be less than, equal to, or slightly greater than $T_B$. The respective precursor flow rates and the $H_2$ content of the $H_2$-based carrier gas are selected to maintain a mole fraction of indium from the indium surfactant to be less than approximately 1% in the p-type GaN layer 20 or any other wafer layers grown over the MQW subassembly during the reduced temperature vapor deposition processing—with the exception of any wafer layers which are designed to contain a functionally significant amount of In. Typically, the mole fraction of indium from the indium surfactant is less than approximately 0.1% in the p-type GaN layer 20 and may, according to the methodology contemplated herein, be less than 0.025% in the p-type GaN layer 20. For wafer layers designed to contain a functionally significant amount of In, the present inventor has recognized that additional In need not be provided as a surfactant because the precursors that are used for the growth of the In-containing wafer layer, e.g., GaInN, would already include a significant amount of In. The carrier gas used for forming these types of In-containing layers will typically be free of $H_2$ because $H_2$ tends to interfere with the incorporation indium in the layers.

The present inventor has recognized that gallium nitride lasers emitting in the blue-green and green wavelength range have GaInN quantum wells with a high indium content. The high indium content makes the quantum wells very susceptible to thermal damage so it can be challenging to grow the waveguide, cladding and contact layers above the quantum wells without damaging the wells. According to the methodology of the present disclosure, this damage can be mitigated because the reduced temperature vapor deposition processing is executed at a reduced temperature $T_G$ that is either less than or only slightly larger than the barrier layer growth temperature $T_B$. For example, in one contemplated embodiment, the barrier layer growth temperature $T_B$ is approximately 875° C. and the reduced temperature $T_G$ is less than approximately 900° C. In other embodiments, it is contemplated that the reduced temperature $T_G$ can be between approximately 700° C. and approximately 900° C.

According to a further aspect of the methodology disclosed herein, the flow rate of the $H_2$-based carrier gas carrier gas is selected to provide an amount of hydrogen sufficient to etch indium from the surface of the p-type GaN layer during the reduced temperature vapor deposition. In this manner, the level of indium from the indium surfactant can be maintained below the aforementioned levels. For example, and not by way of limitation, the carrier gas may be substantially pure hydrogen or may merely comprise a limited amount of hydrogen with other suitable carrier gases. For example, it is contemplated that the concepts of the present disclosure may be practiced by providing a carrier gas that comprises as little as approximately 0.1% by volume hydrogen.

Figure 3:
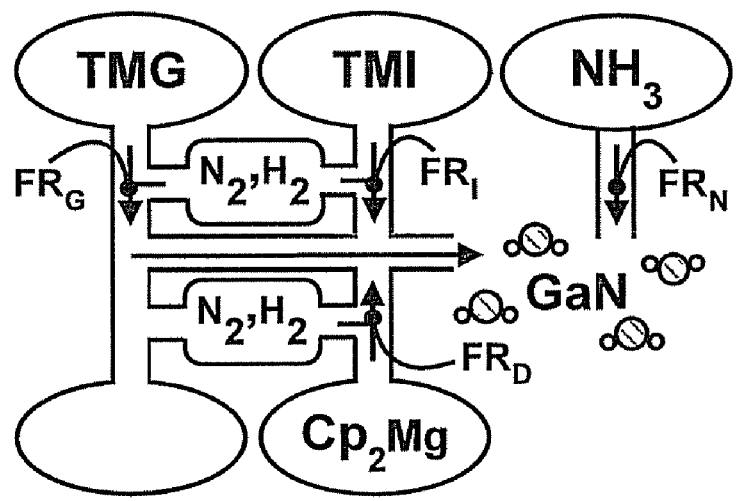
FIG. 3 is a schematic illustration of some of the suitable precursors and flow rates utilized in the methodology of the present disclosure for the growth of GaN.

Regarding preferred flow rates, it is noted that reference herein to a precursor or surfactant flow rate refers to the absolute flow of the precursor or surfactant in moles or μmoles per minute. In the case of the nitrogen precursor, the flow rate is given in standard liters per minute (slpm). Given this clarification, and referring to the schematic illustration of flow rates presented in FIG. 3 for the growth of GaN, it is noted that the nitrogen precursor is introduced at a flow rate $FR_N$, the Ga precursor is introduced at a flow rate $FR_{Ga}$, the dopant precursor is introduced at a flow rate $FR_D$, and the indium surfactant is introduced at a flow rate $FR_I$. According to one embodiment of the present disclosure, the respective flow rates $FR_N$, $FR_{Ga}$, $FR_D$, and $FR_I$ are selected to yield the growth properties and layer characteristics described herein.

In terms of actual flow rates it is contemplated that the respective flow rates $FR_N$, $FR_{Ga}$, $FR_D$, and $FR_I$ can be selected to satisfy the following, although it is contemplated that the flow rates could be smaller or larger than indicated, depending on the particular reactor size and design at hand:

$FR_N \approx 1.0\text{-}15$ slpm $FR_I \approx 0.75\text{-}76.0$ μmoles/min $FR_D \approx 0.005\text{-}0.500$ μmoles/min $FR_{Ga} \approx 4.00\text{-}440$ μmoles/min For one specific embodiment, the respective flow rates $FR_N$, $FR_{Ga}$, $FR_D$, and $FR_I$ can be selected to satisfy the following:

$FR_N \approx 1.0\text{-}15$ slpm $FR_I \approx 19$ μmoles/min $FR_D \approx 0.0843$ μmoles/min $FR_{Ga} \approx 44$ μmoles/min Generally, it is contemplated that the concepts of the present disclosure may be practiced with a reactor indium mole fraction between 5% and 70% and by adhering to the following relation, although excursions outside of these general parameters are contemplated:

$FR_{Ga} > FR_I > FR_D$.

Following growth, the p-type GaN layer can be subjected to annealing at a temperature of less than approximately 650° C., or more preferably a temperature of approximately 550° C. The present inventor has recognized that these relatively low annealing temperatures are particularly well suited for preserving the operational integrity of the device and may be executed in situ without removing the device from the deposition chamber 200. Further, the present inventor has recognized that the aforementioned annealing is effective even in an annealing atmosphere that is substantially free of oxygen, although it is contemplated that annealing can be done in an atmosphere containing oxygen.

Figure 4:
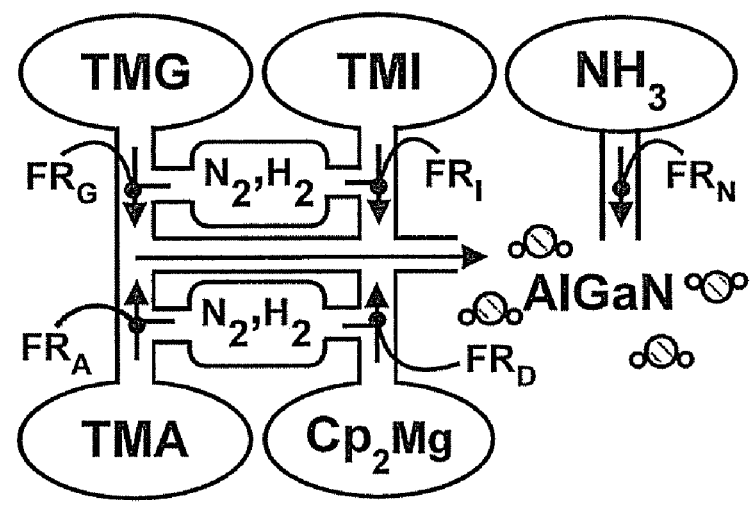
FIG. 4 is a schematic illustration of some of the suitable precursors and flow rates utilized in the methodology of the present disclosure for the growth of AlGaN.

Finally, referring to FIG. 4, it is contemplated that the methodology of the present disclosure may be adapted for use in the growth of AlGaN layers. In which case an additional precursor, preferably in the form of an organometallic source of Al, such as, TMA, would be provided. The flow rate of the Al precursor depends on the Al mole fraction that is desired in the solid. Typically, the Al precursor is provided at a flow rate that is lower than the flow rate associated with the organometallic source of Ga.

It is noted that recitations herein of a component of the present disclosure being "configured" to embody a particular property, or function in a particular manner, are structural recitations, as opposed to recitations of intended use. More specifically, the references herein to the manner in which a component is "configured" denotes an existing physical condition of the component and, as such, is to be taken as a definite recitation of the structural characteristics of the component. Further, it is noted that reference herein to a layer being formed "over" another layer, subassembly, or other structure, is not intended to preclude the presence of one or more intervening layers between the layer that is formed and the structure over which it is formed.

It is also noted that terms like "preferably," "commonly," and "typically," when utilized herein, are not utilized to limit the scope of the claimed invention or to imply that certain features are critical, essential, or even important to the structure or function of the claimed invention. Rather, these terms are merely intended to identify particular aspects of an embodiment of the present disclosure or to emphasize alternative or additional features that may or may not be utilized in a particular embodiment of the present disclosure.

For the purposes of describing and defining the present invention, it is noted that the term "approximately" is utilized herein to represent the inherent degree of uncertainty that may be attributed to any quantitative comparison, value, measurement, or other representation.

Having described the subject matter of the present disclosure in detail and by reference to specific embodiments thereof, it will be apparent that modifications and variations are possible without departing from the scope of the invention defined in the appended claims. More specifically, although the concepts of the present disclosure have been described with reference to a light emitting semiconductor device where a p-type GaN layer is formed over a MQW subassembly, it is contemplated that the concepts of the present disclosure will be equally applicable to cases where an n-type GaN layer is formed over a MQW subassembly and the p-type layers are formed below the MQW subassembly, in which case, the barrier layer growth temperature $T_B$ and the reduced temperature $T_G$ for the n-type layers would both be less than the p-type layer growth temperature. Essentially, the layers grown on top of the MQW would be grown at temperature close to the barrier layer growth temperature regardless of whether it is an n-type layer or a p-type layer.

Similarly, although the concepts of the present disclosure have been described in the context of p and n-type GaN layers, it is contemplated that p and n-type layers can be GaN, GaInN, AlGaN, AlGaInN, an AlGaN/GaN superlattice, an AlGaInN/GaN superlattice, and combinations thereof. Further, although some aspects of the present disclosure are identified herein as preferred or particularly advantageous, it is contemplated that the present disclosure is not necessarily limited to these aspects.

It is noted that one or more of the following claims utilize the term "wherein" as a transitional phrase. For the purposes of defining the present invention, it is noted that this term is introduced in the claims as an open-ended transitional phrase that is used to introduce a recitation of a series of characteristics of the structure and should be interpreted in like manner as the more commonly used open-ended preamble term "comprising."

What is claimed is:

1. A method of manufacturing an optoelectronic light emitting semiconductor device comprising a multi-quantum well (MQW) active region, one or more p-type layers, and one or more n-type layers, wherein:
   the MQW active region is formed over the one or more n-type layers in a vapor deposition process at a quantum well growth temperature $T_Q$ and barrier layer growth temperature $T_B$, where $T_Q \leq T_B$;
   a MQW subassembly comprising the MQW active region and the one or more n-type layers is subjected to reduced temperature vapor deposition processing to form the one or more p-type layers over the MQW subassembly utilizing a plurality of precursors and an indium surfactant;
   the precursors and the indium surfactant are introduced into the vapor deposition process at respective flow rates with the aid of one or more carrier gases, at least one of which comprises $H_2$;
   the reduced temperature vapor deposition processing is executed at a reduced temperature $T_G$, where $T_G \leq T_B \pm 5\%$, in which TG, TB and the range of TB±5% are all expressed in units of degrees Celsius;
   the precursors used in the reduced temperature vapor deposition processing are configured to provide materials for the formation of the one or more p-type layers;
   the indium surfactant comprises an amount of indium sufficient to improve crystal quality of the one or more p-type layers formed during the reduced temperature vapor deposition processing, relative to a crystal quality of the respective p-type layer if formed during the reduced temperature vapor deposition processing without an amount of indium; and
   the respective precursor flow rates and the $H_2$ content of the carrier gas are selected to maintain a mole fraction of indium from the indium surfactant to be less than approximately 1% in the one or more p-type layers during the reduced temperature vapor deposition processing.

2. A method as claimed in claim 1 wherein: the one or more P-type layers do not comprise a functionally significant amount of indium where component precursors for such layers comprise a sufficient amount of indium to act as a surfactant during formation of the layer; and
   the indium surfactant is utilized during the reduced temperature vapor deposition processing to form the one or more p-type layers selected from a waveguide layer, a cladding layer, a capping layer, a barrier layer, a contact layer, an electron blocking layer, or combinations thereof.

3. A method as claimed in claim 1 wherein the reduced temperature $T_G$ is between approximately 700° C. and approximately 900° C.

4. A method as claimed in claim 1 wherein the flow rate of the $H_2$-based carrier gas carrier gas is sufficient to provide an amount of hydrogen sufficient to etch indium from a surface of the p-type layers during the reduced temperature vapor deposition.

5. A method as claimed in claim 1 wherein the carrier gas comprises between approximately 0.1% and approximately 100% by volume hydrogen.

6. A method as claimed in claim 1 wherein the respective precursor flow rates and the $H_2$ content of the $H_2$-based carrier gas are selected to maintain a mole fraction of indium from the indium surfactant to be less than approximately 0.1% in the one or more p-type layers during the reduced temperature vapor deposition processing.

7. A method as claimed in claim 1 wherein the respective precursor flow rates and the $H_2$ content of the $H_2$-based carrier gas are selected to maintain a mole fraction of indium from the indium surfactant to be less than approximately 0.025% in the one or more p-type layers during the reduced temperature vapor deposition processing.

8. A method as claimed in claim 1 wherein:
   the precursors comprise a nitrogen source and one or more organometallic sources of Ga and a crystal lattice dopant;
   the indium surfactant originates from an organometallic source of indium introduced in the reduced temperature vapor deposition process;
   the nitrogen precursor is introduced at a flow rate $FR_N$;
   the Ga precursor is introduced at a flow rate $FR_{Ga}$;
   the dopant precursor is introduced at a flow rate $FR_D$; and
   the indium surfactant is introduced at a flow rate $FR_I$.

9. A method as claimed in claim 8 wherein the respective flow rates $FR_N$, $FR_{Ga}$, $FR_D$, and $FR_I$ satisfy the following relation:

$FR_N \approx 1.0\text{-}15$ slpm $FR_I \approx 0.75\text{-}76.0$ micromoles/min $FR_D \approx 0.005\text{-}0.500$ micromoles/min $FR_{Ga} \approx 4.00\text{-}440$ micromoles/min 10. A method as claimed in claim 8 wherein the respective flow rates $FR_N$, $FR_{Ga}$, $FR_D$, and $FR_I$ satisfy the following relations:

$FR_N \approx 1.0\text{-}15$ slpm $FR_I \approx 19$ micromoles/min $FR_D \approx 0.0843$ micromoles/min $FR_{Ga} \approx 44$ micromoles/min 11. A method as claimed in claim 8 wherein the respective flow rates $FR_{Ga}$, $FR_D$, and $FR_I$ satisfy the following relation:

$$FR_{Ga} > FR_I > FR_D.$$

12. A method as claimed in claim 8 wherein the respective flow rates $FR_{Ga}$, $FR_D$, and $FR_I$ satisfy the following relation $$FR_{Ga} > FR_I > FR_D$$

and are selected to establish a mole fraction of indium inside the reactor of between approximately 5% and approximately 70%.

13. A method as claimed in claim 1 wherein:
the precursors comprise ammonia and one or more organometallic sources of Ga, Al and a crystal lattice dopant; and
the indium surfactant originates from an organometallic source of indium introduced in the reduced temperature vapor deposition process.

14. A method as claimed in claim 1 wherein the method further comprises subjecting the one or more p-type layers to annealing at a temperature of less than approximately 650° C.

15. A method as claimed in claim 1 wherein the method further comprises subjecting the one or more p-type layers to in situ annealing at a temperature of approximately 550° C.

16. A method as claimed in claim 1 wherein the method further comprises subjecting the one or more p-type layers to substantially oxygen-free annealing.

17. A method as claimed in claim 1 wherein the barrier layer growth temperature $T_B$ and the reduced temperature $T_G$ are both less than the n-type growth temperature $T_N$.

18. A method as claimed in claim 1 wherein the one or more n-type layers, the MQW active region, and the one or more p-type layers are formed in a common deposition chamber.

19. A method of manufacturing an optoelectronic light emitting semiconductor device comprising a multi-quantum well (MQW) active region, one or more p-type layers, and one or more n-type layers, wherein:
the MQW active region is formed over the one or more p-type layers in a vapor deposition process at a quantum well growth temperature $T_Q$ and barrier layer growth temperature $T_B$, where $T_Q \leq T_B$;
a MQW subassembly comprising the MQW active region and the one or more p-type layers is subjected to reduced temperature vapor deposition processing to form the one or more n-type layers over the MQW subassembly utilizing a plurality of precursors and an indium surfactant;
the precursors and the indium surfactant are introduced into the vapor deposition process at respective flow rates with the aid of one or more carrier gases, at least one of which is $H_2$;
the reduced temperature vapor deposition processing is executed at a reduced temperature $T_G$, where $T_G \leq T_B \pm 5$, in which TG, TB and the range of TB±5% are all expressed in units of degrees Celsius;
the precursors used in the reduced temperature vapor deposition processing are configured to provide materials for the formation of the one or more n-type layers;
the indium surfactant comprises an amount of indium sufficient to improve crystal quality of the one or more n-type layers formed during the reduced temperature vapor deposition processing, relative to a crystal quality of the respective p-type layer if formed during the reduced temperature vapor deposition processing without an amount of indium; and
the respective precursor flow rates and the $H_2$ content of the $H_2$-based carrier gas are selected to maintain a mole fraction of indium from the indium surfactant to be less than approximately 1% in the one or more n-type layers during the reduced temperature vapor deposition processing.

20. A method of manufacturing an optoelectronic light emitting semiconductor device comprising a multi-quantum well (MQW) active region, one or more p-type layers, and one or more n-type layers, wherein:
the MQW active region is formed over either the one or more n-type layers or the one or more p-type layers in a vapor deposition process;
a MQW subassembly comprising the MQW active region and the one or more n-type layers or the one or more p-type layers is subjected to reduced temperature vapor deposition processing to form the one or more p-type layers or the one or more n-type layers over the MQW subassembly utilizing a plurality of precursors and an indium surfactant;
the precursors and the indium surfactant are introduced into the vapor deposition process at respective flow rates with the aid of one or more carrier gases, at least one of which comprises $H_2$;
the precursors used in the reduced temperature vapor deposition processing are configured to provide materials for the formation of the one or more p-type layers or the one or more n-type layers;
the indium surfactant comprises an amount of indium sufficient to improve crystal quality of the one or more p-type layers or the one or more n-type layers during the reduced temperature vapor deposition processing, relative to a crystal quality of the respective layer if formed during the reduced temperature vapor deposition processing without an amount of indium; and
the respective precursor flow rates and the $H_2$ content of the $H_2$-based carrier gas are selected to maintain a mole fraction of indium from the indium surfactant to be less than approximately 1% in the one or more p-type layers or the one or more n-type layers during the reduced temperature vapor deposition processing.

* * * * *